(12) United States Patent
Morillas Bueno et al.

(10) Patent No.: US 8,604,395 B2
(45) Date of Patent: Dec. 10, 2013

(54) CONTROL SYSTEM FOR AN ELECTRICAL APPLIANCE

(75) Inventors: Begoña Morillas Bueno, Bilbao (ES);
Daniel de los Toyos Lopez, Eibar (ES);
Asier de la Torre Abaunza, Durango (ES)

(73) Assignee: Eika, S., Etxebarria (Bizkaia) (ES)

( * ) Notice: Subject to any disclaimer, the term of this patent is extended or adjusted under 35 U.S.C. 154(b) by 1351 days.

(21) Appl. No.: 12/171,768

(22) Filed: Jul. 11, 2008

(65) Prior Publication Data

US 2009/0014432 A1    Jan. 15, 2009

(30) Foreign Application Priority Data

Jul. 12, 2007    (ES) ................ 200701501 U

(51) Int. Cl.
*H05B 3/68*    (2006.01)
*H05B 3/02*    (2006.01)

(52) U.S. Cl.
USPC ....................................... 219/457.1; 219/482

(58) Field of Classification Search
USPC ............ 219/443.1–468.2, 482–486, 507, 508
See application file for complete search history.

(56) References Cited

U.S. PATENT DOCUMENTS

| | | | | |
|---|---|---|---|---|
| 5,321,229 A | * | 6/1994 | Holling et al. | 219/445.1 |
| 6,198,080 B1 | * | 3/2001 | Rice et al. | 219/506 |
| 7,355,164 B2 | * | 4/2008 | Arnold | 250/227.22 |

FOREIGN PATENT DOCUMENTS

| | | |
|---|---|---|
| DE | 102005004066 | 7/2006 |
| DE | 102005004337 | 7/2006 |
| ES | 2122730 | 12/1998 |
| ES | 2240865 | 10/2005 |

* cited by examiner

*Primary Examiner* — Sang Y Paik
(74) *Attorney, Agent, or Firm* — Tim L. Kitchen; Peter B. Scull; Hamilton DeSanctis & Cha LLP

(57) ABSTRACT

A control system for an electrical appliance, such as a cooking range, that includes a safety switch and one or more auxiliary switches arranged in proximity to the safety switch. The control system is configured to interrupt power to the electrical appliance when only the safety switch is activated and to permit the supply of power to the electrical appliance when the safety switch and an auxiliary switch are simultaneously activated.

14 Claims, 2 Drawing Sheets

CONTROL SYSTEM FOR AN ELECTRICAL APPLIANCE

CROSS-REFERENCE TO RELATED APPLICATIONS

This application claims priority to Spanish Patent Application ES-U200701501, filed Jul. 12, 2007.

TECHNICAL FIELD

The present invention relates to a remote control system for an electrical appliance, in particular for a vitroceramic cooking range.

BACKGROUND

There are known remote control systems for vitroceramic cooking ranges that include a transmitter and an infrared or radio frequency receiver sensor located over or under the ceramic glass, with the control devices for the corresponding heater element located at the front of an electrical appliance such as a smoke extractor or on a remote control unit that communicates with the vitroceramic cooking range via infrared rays or radio frequency, and integrated in the control units are start-up and shutdown switches and the corresponding heat source power regulation knobs.

ES 2240865T3 discloses a voice-recognition remote control system of a smoke extractor and of a vitroceramic cooking range. For this purpose, the cooking range includes a transmission and reception unit that communicates through a known wireless transmission path with a smoke extractor arranged over the cooking range. In order to communicate with the cooking range, the smoke extractor has a transmitter/receiver unit and control devices through which the smoke extractor functions are activated or viewed. Furthermore, it also includes a voice control unit that integrates a microphone, a voice recognition device and a voice evaluating unit that sends a signal to control the smoke extractor and/or the cooking range. The cooking range also includes a control and visualization unit for reasons of comfort and safety. The size of the control and visualization unit is scalable for use in safety equipment.

One of the vitroceramic cook top drawbacks is a possible involuntary connection or disconnection of the different cooking range heater element. ES 2122730 T3 discloses a cooking range control remote unit attached under the vitroceramic cook top, comprising a connection/disconnection switch set up in such a way that when the connection is established, a delay occurs so that the user must press the connection/disconnection switch during a certain period of time before the switch reacts. The delay time is provided for reasons of safety and control. For example, if cleaning the vitroceramic plate, the connection/disconnection switch is rubbed with a cloth, and if the delay time does not exist, a continuous connection/disconnection will occur. However, the safety system does not work if a pot or the hand is involuntarily arranged during a period of time exceeding the delay time.

In DE 102005004066 A1 an electrical appliance, in particular a vitroceramic cooking range, is disclosed wherein in order to avoid mistakes it is necessary to press twice or more consecutive times a sensor or switch for operation to prevent involuntary activation, and in DE 102005004337 A1 a vitroceramic cooking range is also described wherein order to avoid mistakes, it is necessary to press first a main switch and afterwards an auxiliary switch to activated the control unit.

SUMMARY OF THE DISCLOSURE

It is an object of the present invention to provide a control system for an electrical appliance, in particular for a vitroceramic cooking range, as defined in the claims.

The control system according to one embodiment includes a vitroceramic cooking range control unit that controls at least a heater element arranged under a cooking plate, with the control unit communicating at least with a heater element via a wireless system, a receiver arranged under the cooking plate to receive signals from the control unit, and a safety switch arranged on the cooking plate. The remote control system comprises at least an auxiliary switch arranged under the cooking plate, which is hidden to the user, with the auxiliary switch being connected to an evaluating circuit, so that when the user involuntarily activates the safety switch and at least one of the auxiliary switches, the control switch detects that the safety switch activation was involuntary.

This provides a safe remote control system that enables the user to disconnect the heater element by using the safety switch arranged under the cooking plate, even when the wireless communication system does not work properly, and on the other hand, it prevents the safety switch from involuntarily activating, which is detected by the evaluating circuit of the system when the safety switch and at least one of the auxiliary switches are simultaneously activated.

In one embodiment is provided a control system for a cooking range having a heater element arranged under a ceramic cooking plate, the control system configured to control the supply of power to the heater element and the control system comprising a safety switch arranged under the cooking plate that can be activated from a top surface of the cooking plate; and an auxiliary switch arranged under the cooking plate that is activated from the top surface of the cooking plate, the auxiliary switch hidden from a user of the cooking range and positioned a first distance from the safety switch, the control system configured to interrupt the supply of power to the heater element when the safety switch is activated and to permit the supply of power to the heater element when both the safety switch and the auxiliary switch are activated.

This and other characteristics and advantages of the invention will be made evident in the light of the drawings and the detailed description thereof.

BRIEF DESCRIPTION OF THE DRAWINGS

Preferred embodiments of the present disclosure are described herein with reference to the drawings wherein.

DETAILED DESCRIPTION

Figure 1:
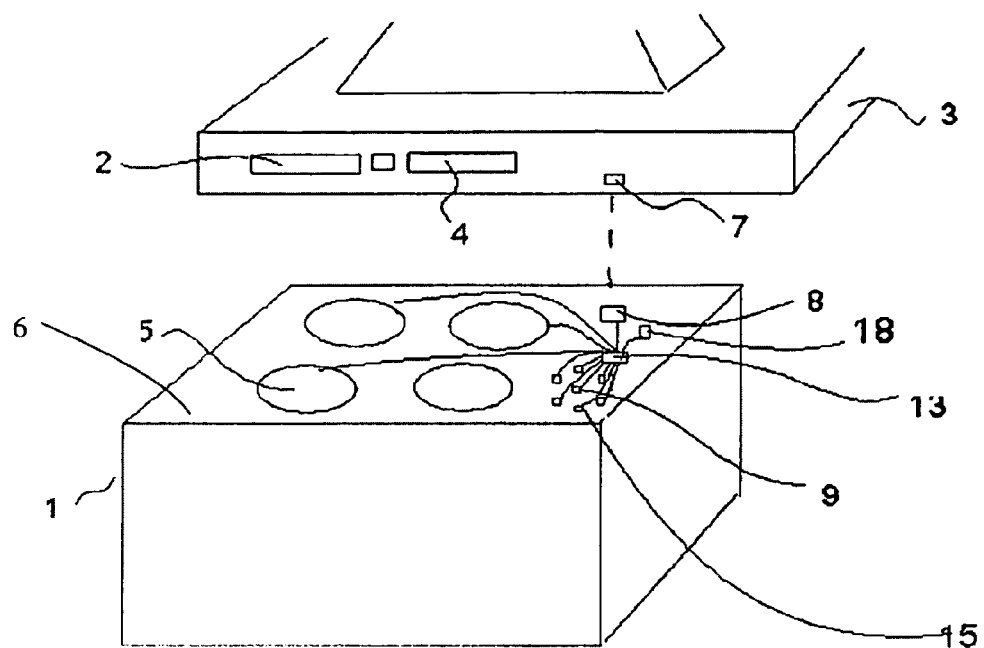
FIG. 1 is a three-dimensional view of an embodiment of a control system for a vitroceramic cooking range.

FIG. 1 shows schematically a vitroceramic cooking range 1 that comprises heater elements 5 arranged under a vitroceramic cooking plate 6, and a smoke extractor 3, arranged over the vitroceramic cooking range 1, which integrates the control unit 2 on a vitroceramic cooking range 1 front panel and a control unit 4 of the smoke extractor 3 itself.

The system used to remotely control the heater elements 5 from the control unit 2 inserted in the smoke extractor 3, comprises a transmitter 7 inserted on the smoke extractor 3 and connected to the control unit 2, and a receiver 8 installed under the cooking plate 6 and communicated with heater elements 5, with communications between the transmitter 7 and the receiver 8 taking place through a wireless, generally short-range, radio frequency or infrared transmission system.

The receiver 8 can be installed under cooking plate 6 or on top of the cooking plate 6 itself, preferably aligned with the transmitter 7 that is arranged on a smoke extractor 3 surface which is typically substantially parallel to cooking plate 6.

In normal working conditions, the user turns on the required heater element 5 by activating the corresponding control unit 2 on the smoke extractor 3; subsequently, the control unit 2 sends an electrical signal to the transmitter 7 which sends the order to receiver 8 on cooking plate 6, activating the corresponding heater element 5.

For safety purposes and in order to prevent that, in case of a wrong running of the wireless communication between smoke extractor 3 and vitroceramic cooking range 1, heater elements 5 continue to work despite the user having activated on the main control unit 2 the switch-off order for the heater elements 5, the remote control system according to the invention includes under the cooking plate 6, a safety switch 9 connected to the heater elements 5 that interrupts the electric power that feeds heater elements 5. The safety switch 9 can be a single switch that automatically disconnects all the heater elements 5 for safety purposes or be a safety switch 9 associated to each heater element 5.

Figure 2:
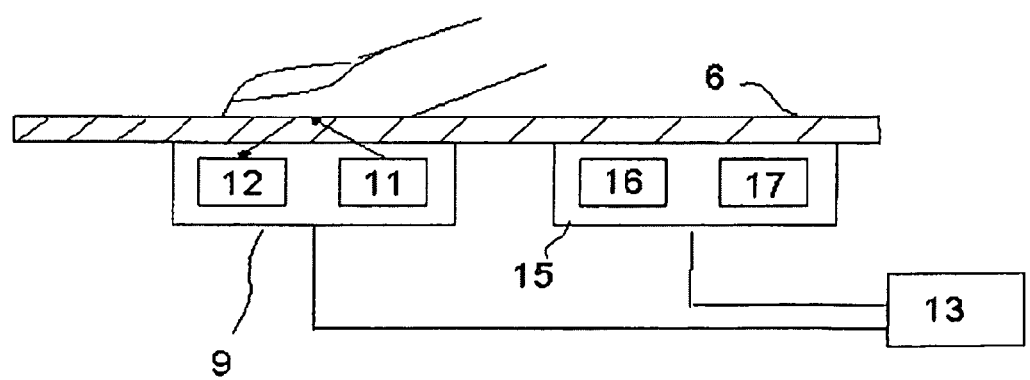
FIG. 2 is a schematic view of a safety switch and of an auxiliary switch in one embodiment.
Figure 3:
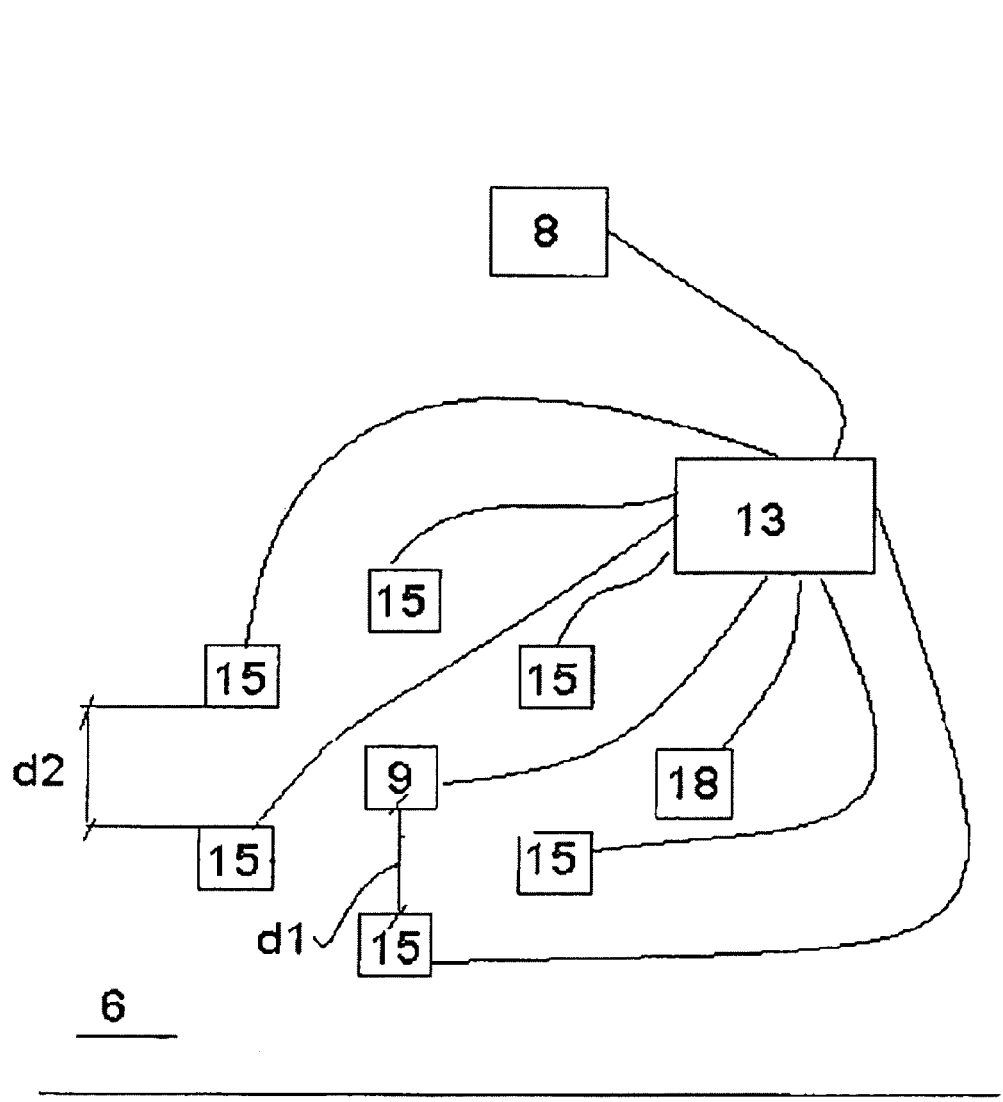
FIG. 3 is a detailed view of the set up of the safety switch and auxiliary switches in FIG. 1.

The safety switch 9, shown in detail in FIG. 2, is a tactile connect/disconnect switch of opto-electronic type that includes an optical sensor which has an infrared transmitter 11 and an infrared receiver 12, both arranged under cooking plate 6, on a circuit board not shown, so that when the user's finger is arranged on cooking plate 6 over the infrared transmitter 11, it acts as a receiver, reflecting part of the radiation transmitted from the infrared transmitter 11 to the infrared receiver 12, which sends a signal to an evaluating circuit 13, shown in FIGS. 1 and 3, in order to interrupt the power supply to heater elements 5. The safety switch can also be of a capacitive type.

In order to prevent the safety switch 9 to be involuntarily activated, switching off the heater elements 5 that were voluntarily turned on by the user, the remote control system of the invention includes under cooking plate 6 auxiliary connect/disconnect switches 15 connected to the evaluating circuit 13. The auxiliary switches 15 are inserted next to safety switch 9, but sufficiently far from the safety switch 9 in order to avoid interferences. In the performance of the invention shown in detail in FIG. 3, the cooking plate 6 includes auxiliary switches 15 that are arranged angularly equidistant from the safety switch 9, which is centred with regard to the auxiliary switches 15, a first distance d1 being the distance between each one of the auxiliary switches 15 and the safety switch 9, and d2, a second distance between auxiliary switches 15. The first distance d1 must be such to prevent the user from simultaneously pressing an auxiliary switch 15 and safety switch 9 with a finger. On the other hand, the first distance d1 cannot be too big since in such case an accidental activation of safety switch 9 can occur which would not be detected by evaluating circuit 13 with none of the auxiliary switches 15 having been activated because of being arranged too far from safety switch 9. Therefore, the first optimum distance d1 is the minimum distance preventing a user from pressing safety switch 9 and at least an auxiliary switch 15 with a standard finger. Preferably, the distance d1 is between about 40.0 mm and about 100 mm.

The second distance d2 will depend on the specific action area of auxiliary switches 15, considering that the widest area possible around safety switch 9 is to be covered, more or less auxiliary switches 15 are required.

The auxiliary switches 15 are inserted under cooking plate 6 and are similar to the safety switch 6 that is visible to the user, that is, they are tactile connect/disconnect switches of opto-electronic type that include an infrared transmitter 17 and an infrared receiver 16 respectively. The auxiliary switches 15 are hidden to the user to prevent the user from consciously activating or deactivating them. Cooking plate 6 also includes indicator means 18 such as a LED. Thus, when the safety switch 9 is involuntarily activated, for example when a cooking pot is arranged on top of it, or when a cooking plate 6 is being cleaned, or when the user places the hand on the cooking plate 6, at least one of the auxiliary switches 15 is simultaneously activated, so that the evaluating circuit 13 transmits a signal to LED 18 to blink in order to warn the user of this situation, and in case that the cause of an accidental activation of safety switch 9 and auxiliary switch 15 is not eliminated, the evaluating circuit 13 will disable safety switch 9, that is, if heater elements 5 were turned off they will continue to be turned off, and otherwise if any of them was turned on, they will maintain the status. In other examples not shown in the figures, besides or replacing LED 18, an acoustic device sending a sound signal to the user can be included.

Control units 2 of heater elements 5 are known which includes on/off push buttons, as well as power regulation push buttons, not shown in the figures. In a first embodiment, the control units 2 are inserted in the smoke extractor 2, although they can be mounted on a remote control unit which controls the running functions of the vitroceramic cooking range 1.

What is claimed is:

1. A control system for a cooking range having a heater element arranged under a ceramic glass cooking plate, the control system configured to control the supply of power to the heater element and the control system comprising:
   a safety switch arranged under the cooking plate that can be activated from a top surface of the cooking plate; and
   an auxiliary switch arranged under the cooking plate that is activated from the top surface of the cooking plate, the auxiliary switch hidden from a user of the cooking range and positioned a first distance from the safety switch,
   the control system configured to interrupt the supply of power to the heater element when only the safety switch is activated and to permit the supply of power to the heater element when the safety switch and the auxiliary switch are simultaneously activated.

2. A control system according to claim 1 wherein the first distance is sufficient to prevent the user from activating the safety switch and the auxiliary switch with a single finger.

3. A control system according to claim 1 wherein the safety switch and the auxiliary switch are tactile switches.

4. A control system according to claim 3 wherein the safety switch and auxiliary switch each comprise an infrared transmitter and an infrared receiver.

5. A control system according to claim 1 further comprising an indicator that warns the user when the safety switch and auxiliary switch are simultaneously activated.

6. A control system according to claim 5 wherein the indicator is a LED device.

7. A control system according to claim 5 wherein the indicator is an acoustic device.

8. A control system according to claim 1 further comprising a control unit having a transmitter that wirelessly communicates with a receiver on the cooking range to control the heater element.

9. A control system according to claim 8 wherein the control unit is located on a smoke extractor situated above the cooking range.

10. A control system according to claim 1 comprising a plurality of auxiliary switches.

11. A control system according to claim 10 wherein the plurality of auxiliary switches are equidistantly spaced from the safety switch.

12. A control system according to claim 10 wherein the auxiliary switches are arranged angularly equidistant from each other.

13. A control system according to claim 3 wherein the safety switch and auxiliary switch are each opto-electronic type switches.

14. A control system according to claim 3 wherein the safety switch and auxiliary switch are each capacitive type switches.

\* \* \* \* \*